Figure 4A:
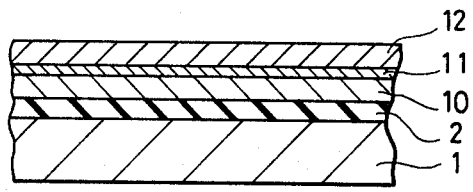

United States Patent [19]

Okazaki et al.

[11] 4,315,984

[45] Feb. 16, 1982

[54] METHOD OF PRODUCING A SEMICONDUCTOR DEVICE

[75] Inventors: Shinji Okazaki, Urawa; Kozo Mochiji, Tachikawa; Susumu Takahashi, Hinodemachi; Fumio Murai, Hachioji, all of Japan

[73] Assignee: Hitachi, Ltd., Tokyo, Japan

[21] Appl. No.: 176,799

[22] Filed: Aug. 11, 1980

[30] Foreign Application Priority Data

Aug. 13, 1979 [JP] Japan .............................. 54-102245

[51] Int. Cl.$^3$ ............................................. B05D 3/06
[52] U.S. Cl. ...................................... 430/296; 427/89; 427/90; 427/90; 427/91; 427/96; 427/99; 430/312; 430/316; 156/643
[58] Field of Search ...................... 427/43.1, 162, 163, 427/89, 90, 91, 96, 99; 430/312, 316, 296, 321; 156/643

[56] References Cited

U.S. PATENT DOCUMENTS 3,649,393  3/1972  Hatzakis ............................ 156/643
3,930,857  1/1976  Benoz et al. ....................... 430/312
4,001,061  1/1977  Ahn et al. .......................... 427/96
4,035,522  7/1977  Hatzakis ............................ 430/296
4,040,891  8/1977  Chang et al. ...................... 427/89

*Primary Examiner*—John H. Newsome
*Attorney, Agent, or Firm*—Craig and Antonelli

[57] ABSTRACT

That region of a resist film in which a contact is to be formed and that region thereof in which an interconnection is to be formed are respectively irradiated with an electron beam in a dose substantially equal to an optimum dose of the resist film and in a dose less than the optimum dose. Thereafter, the resist film is developed.

By performing dry etching, an opening extending to a substrate is provided in the region in which the contact is to be formed, and the surface of an insulating film overlying the substrate is exposed in the region in which the interconnection is to be formed.

After depositing a conductive metal film on the whole surface the remaining resist film is removed together with the metal film deposited thereon, whereby the contact and the interconnection are formed.

5 Claims, 17 Drawing Figures

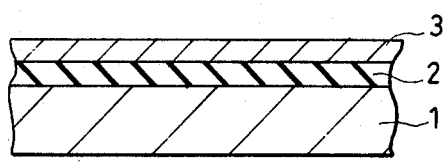
FIG.1a
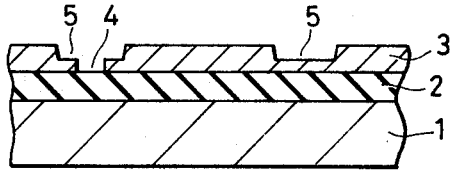
FIG.1b
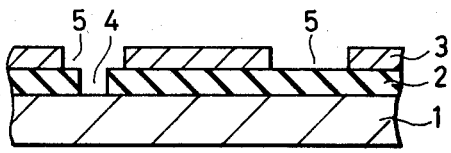
FIG.1c
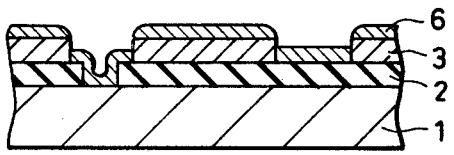
FIG.1d
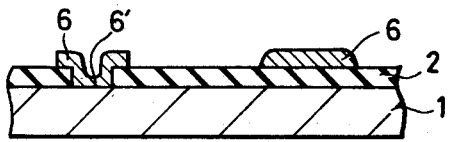
FIG.1e
FIG. 2
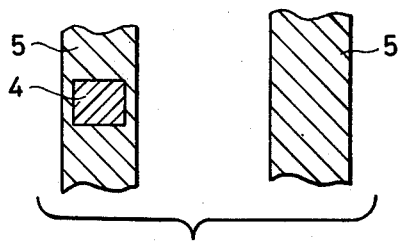

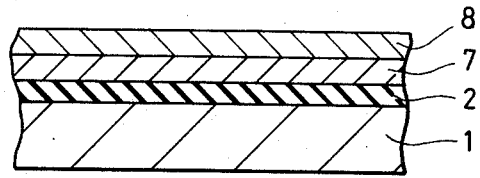
FIG.3a
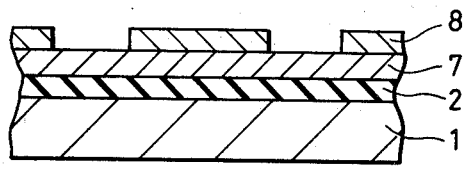
FIG.3b
FIG.3c
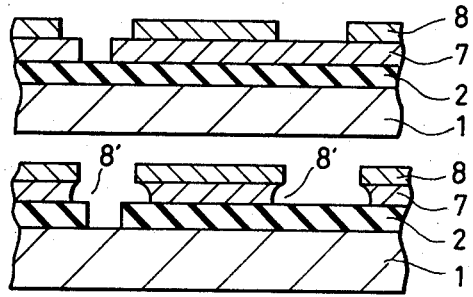
FIG.3d
FIG.3e

METHOD OF PRODUCING A SEMICONDUCTOR DEVICE

This invention relates to a method of producing a semiconductor device, and more particularly to a method in which the registration between a contact hole and a metal interconnection can be made with high precision by the use of electron-beam lithography.

As is well known, various semiconductor devices are produced with a technology which is usually called photolithography. This technology involves a process wherein a photoresist film is deposited on a workpiece, the film is exposed to light through a mask having a desired pattern and then developed, to form a resist pattern corresponding to the desired pattern, and dry or wet etching is thereafter carried out to remove exposed parts of the workpiece.

In producing a semiconductor device, the process steps from the deposition of the photoresist film to the etching need to be performed repeatedly. Herein, each time the mask is situated at a predetermined position, inevitably some error develops. In the production of the semiconductor device, therefore, an allowance which corresponds to the errors developing during the mask registrations must be set. This has formed one of serious causes hampering the enhancement of the density of integration of the semiconductor device.

In order to solve such problem, a method called "self-alignment" has been proposed as a method which need not allow for such registration errors. This method has already been used in many cases.

As is well known, the "self-alignment" method is a technique according to which two or more layers to be aligned are aligned without adding any special means for the alignment.

With this technique, the occupying area decreases conspicuously, which is very effective for rendering high the density of integration and the operating speed of semiconductor devices, reducing the stray capacitance thereof, etc. The technique has, therefore, been extensively employed for the manufacture of the semiconductor devices. However, it has not been employed for the formation of a contact hole or the registration between a contact hole and an interconnection.

That is, the manufacturing step of providing an opening in an insulating film so as to form a contact hole and the manufacturing step of etching a conductor film of metal, polycrystalline silicon or the like into a predetermined pattern so as to form an interconnection pattern joined to a contact hole have still been executed with the conventional photo-lithography.

Therefore, a large number of drawbacks including an increase in the number of steps, complication of a process, occurrence of defects attributed to the error of the mask registration, an increase in the required area, etc. have been involved, and improvements have been eagerly requested.

Especially in case of large-scale integrated circuits (LSIs), interconnection parts account for about 25–50% of the whole chip area, and hence, the reduction of the area of the interconnection parts is very important for decreasing the area of a semiconductor chip. Heretofore, however, it has been impossible to reduce the areas of the contact hole and the part of the interconnection joined thereto as described above. This has unavoidably been a serious obstacle to the enhancement of the density of integration.

An object of this invention is to solve the problems of the prior art method of producing semiconductor devices, and to provide a method capable of producing a semiconductor device of a high density of integration.

Another object of this invention is to provide a method of producing a semiconductor device in which the required area of interconnection parts is small. Still another object of this invention is to provide a method of producing a semiconductor device as can form a contact hole and an interconnection joined thereto with ease and with high precision.

In order to accomplish the objects, this invention provides a method wherein parts of a resist film in which a contact hole and an interconnection are at be formed are, respectively, irradiated with electron beams of different intensities, thereby to form a resist pattern whose thickness varies locally, whereby the contact hole and the interconnection are formed at substantially the same degree of precision as that of the self-alignment technique.

FIGS. 1(a)–1(e), 3(a)–3(e) and 4(a)–4(f) of the accompanying drawings are flow diagrams, respectively, showing different embodiments of this invention, and FIG. 2 is a diagram for explaining a method of irradiation with an electron beam in this invention.

Hereunder this invention will be described in detail with reference to the following embodiments:

EMBODIMENT 1

First, as shown in FIG. 1(a), a phosphosilicate glass (hereinbelow abbreviated to "PSG") film 2 of a thickness of 0.6 $\mu$m owing to the CVD (chemical vapor deposition) process and a polymethyl isopropylenyl ketone (hereinbelow abbreviated to "PMIPK") film 3 of a thickness of 1.3 $\mu$m as a positive type electron-beam resist are stacked and deposited on a silicon semiconductor substrate 1 wherein a part of the device such as a diffused layer 1 is formed.

Subsequently, as illustrated by a plan view in FIG. 2, using an electron beam, that part 4 of the resist film in which a contact hole is to be formed is subjected to an irradiation with approximately 30% (about $3 \times 10^{-5}$ coulomb/cm$^2$) of the optimum dose (about $1 \times 10^{-4}$ coulomb/cm$^2$), whereupon parts 4 and 5 in which interconnections are to be formed are subjected to an irradiation with approximately 70% (about $7 \times 10^{-5}$ coulomb/cm$^2$) of the optimum dose. As a result, the part 4 in which the contact hole is to be formed is irradiated with the sum of the doses of the two irradiations.

When such irradiations are conducted, the sum of the doses of the two irradiations in the part 4 in which the contact hole is to be formed reaches substantially the optimum dose. As shown in FIG. 1(b), therefore, when development is carried out, the resist film 3 of the part 4 in which the contact hole is to be formed is fully removed to expose the surface of the PSG film 2, and the thickness of the resist film 3 of the parts 5 in which the interconnections are to be formed decreases to approximately 0.3 $\mu$m.

Subsequently, the resultant substrate is processed by a reactive sputter-etching which employs as its atmosphere gas a mixed gas consisting of C$_4$F$_8$ and He. Then, as shown in FIG. 1(c), that part of the PSG film 2 in which the surface is exposed is removed to form the contact hole, and simultaneously, the thinner resist film is removed to expose the surface of the PSG film 2. At the next step, a film 6 of, for example, aluminum is deposited as a metal film for interconnections by the vacuum evaporation as shown in FIG. 1(d). Thereafter, when the remaining resist film 3 is removed using the organic solvent or the photoresist remover and others along with the aluminum film 6 deposited thereon, a contact 6' extending to the interconnection on the PSG film 2 and the substrate 1 is formed together with the interconnection 6 overlying the PSG film 2 as shown in FIG. 1(e).

As described above, according to this invention, the irradiation of those parts of the resist film in which the contact hole and the interconnections are to be formed are executed with the electron beam, and a mask for exposure to light is not used. It is, therefore, unnecessary to repeatedly perform mask registrations as in case of irradiating the workpiece with light. In consequence, errors attendant upon the mask registrations do not develop at all. Moreover, since the precision of the positioning by the electron beam is as very excellent as within $\pm 0.1$ $\mu$m, the contact hole can be formed at the same degree of excellent precision as that of the self-alignment technique.

In the present embodiment, the doses for the parts in which the contact hole and the interconnections are to be formed have been made 30% and 70% of the optimum dose for forming an exact resist pattern, respectively. Needless to say, however, the contact hole and the interconnections can be formed without hindrance even when the doses are somewhat different from these specified values.

However, when the sum of the doses is conspicuously greater than the optimum dose, the magnitude of the resist film to be removed by the development increases, and the shapes become inaccurate. It is, therefore, better to avoid any excessive irradiation, i.e. greater than the optimum dose.

The doses of the electron beam for the parts in which the contact hole and the interconnection are to be formed are approximately 10–60% and 90–40% of the optimum dose in practical use, respectively. The doses are selected so that their sum may become substantially equal to the optimum dose.

It is a matter of course that besides PSG, various materials such as silicon dioxide and silicon nitride can be employed for the insulating film.

EMBODIMENT 2

The present embodiment is an example wherein two kinds of resist films of different properties are stacked and used instead of the single-layer resist film 3 used in Embodiment 1.

As shown in FIG. 3(a), a PSG film 2, a first resist film 7 and a second resist film 8 are successively deposited on a silicon substrate 1. The first and second resists 7 and 8 to be used are such that the relations of a good solvent and a poor solvent in development are opposite to each other and that the second resist film 8 is higher in sensitivity than the first resist film 7.

That is, the resists to be employed are selected as follows. An irradiated part of the first resist film is removed by a certain liquid developer A, but that of the second resist film is not removed by the same developer. In case of using another liquid developer B, the irradiated part of the first resist film is not removed, but that of the second resist film is removed. Moreover, the second resist film has a sensitivity higher than that of the first resist film.

As the first and second resist films fulfilling such conditions, many sorts of resists can be employed. In the present example, P (MMA-MA) being the copolymer between PMMA (polymethyl methacrylate) and MA (methyl acrylate) was used as the second resist, and PMIPK (polymethyl isopropylenyl ketone) as the first resist. After prebaking the first and second resist films at 150° C. for 60 minutes, they were irradiated with an electron beam in the same manner as in Embodiment 1. The resist films overlying parts on which interconnections were to be formed were irradiated with an optimum dose for the second resist 8, and those overlying a part on which a contact hole was to be formed were irradiated with an optimum dose for the first resist 7. The doses in the present example were on the order of $10^{-5}$ and $10^{-4}$ coulomb/cm$^2$, respectively.

The second resist film 8 is developed by the use of a liquid developer suitable therefor (a mixed solvent consisting of methyl isobutyl ketone and isopropanol at a volumetric ratio of 2:1). Then, as shown in FIG. 3(b), only the irradiated parts of the second resist film 8 are removed, and the first resist film 7 remains unremoved because it is not developed by the above-mentioned liquid developer.

Subsequently, the first resist film 7 is developed with a liquid developer suitable therefor (a mixed solvent consisting of ethyl acetate and n-butyl cellosolve at a volumetric ratio of 3:4). Then, since that part of the first resist film 7 in which the contact hole is to be formed has been irradiated with the optimum dose of the first film 7 as described above, it is removed as shown in FIG. 3(c), and the surface of the PSG film 2 is exposed.

After removing the exposed part of the PSG film 2 with a fluoric acid-ammonium fluoride solution (mixed solution at 1:10), those parts of the first resist film 7 in which the interconnections are to be made are removed with a developer which employs a ketone type liquid developer (methyl isobutyl ketone). In this case, since the dose for the parts in which the interconnections are to be made is less than the optimum dose for the first resist film 7 as described above, a sensitization for enhancing the solubility of the resist is performed. As shown in FIG. 3(d), therefore, the first resist film 7 is side-etched and eaves 8' of the second resist film 8 are formed.

The temperature and developing time of a liquid developer in the sensitization performed in this case are, for example, 25° C. and 2 minutes, respectively; whereby the first resist film 7 is side-etched approximately 0.5 $\mu$m.

In the same way as in Embodiment 1, an aluminum film 9 is deposited on the entire area by vacuum evaporation, whereupon the first and second resist films 7 and 8 are removed together with the aluminum film 9 deposited thereon (such removal of the aluminum film is usually termed "lift-off"). Then, as shown in FIG. 3(e), the aluminum film 9 is left only in the parts in which the contact and the interconnections are to be formed, so that the contact 9' with the substrate 1 and the interconnections 9 on the PSG film 2 are, respectively, formed. In this case, since the eaves owing to the second resist film 8 exist as described above, the formation of the contact and the interconnections by the lift-off is executed very favorably. In the present example, when the PMIPK was replaced with PMMA (polymethyl methacrylate) as the first resist, a very acceptable result was obtained.

EMBODIMENT 3

The present embodiment indicates an example wherein a resist film whose solubility increases by irradiation with an electron beam and a photoresist film whose solubility increases by irradiation with ultraviolet rays are employed, between which a polycrystalline silicon film is interposed as a protective film for the photoresist film in the case of developing the resist film.

As shown in FIG. 4(a), a PSG film 2, a photoresist ("AZ1350J" produced by Shipley Inc.) film 10, a polycrystalline silicon film 11 as an intermediate film (protective film) and a resist (PMMA) film 12 capable of reacting to an electron beam are stacked and deposited on a silicon substrate 1 in the order mentioned.

As in Embodiment 1, a part in which a contact hole is to be formed is first irradiated with the electron beam to the extent of 30% of an optimum dose. Subsequently, parts in which interconnections are to be made are irradiated to the extent of 70% of the optimum dose. Thus, the part in which the contact hole is to be formed is irradiated the sum of both the doses.

Figure 4B:
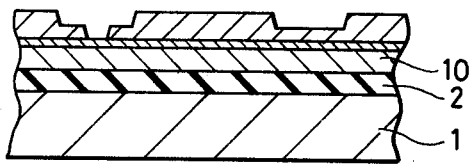

When the workpiece is developed, as illustrated in FIG. 4(b), that part of the resist film 12 in which the contact hole is to be formed is fully removed to expose the surface of the polycrystalline silicon film 11, while the resist film 12 is not fully removed and has its thickness reduced in the parts in which the interconnections are to be formed.

Figure 4C:
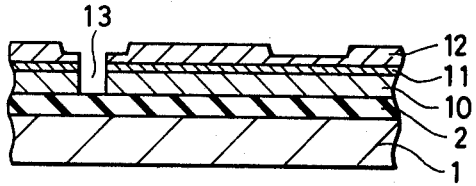

The exposed part of the polycrystalline silicon film 11 is removed by a reactive sputter-etching employing $CF_4$, and further, the whole surface is irradiated with ultraviolet rays. Then, in the photoresist film 10, only the part exposed by the removal of the polycrystalline silicon film 11 is exposed to the ultraviolet rays and has its solubility increased. Therefore, when development is carried out after the irradiation with the ultraviolet rays, an opening 13 is formed as shown in FIG. 4(c).

Figure 4D:
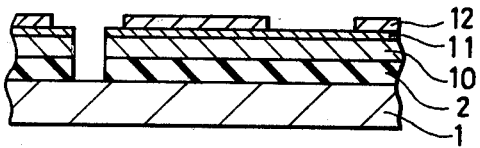

Subsequently, using the reactive sputter-etching, the exposed part of the PSG film 2 is removed to form the contact hole. In this case, also the thickness of the resist film 12 decreases, with the result that as shown in FIG. 4(d), the thinner resist film corresponding to the parts in which the interconnections are to be formed are removed to expose the surface of the polycrystalline silicon film 11.

Figure 4E:
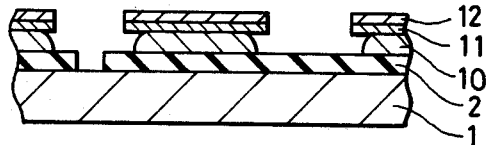

After removing the exposed parts of the polycrystalline silicon film 11 by the use of the reactive sputter-etching employing $CF_4$, the whole surface is irradiated with intense ultraviolet rays, and the workpiece is subjected to development. Thus, as shown in FIG. 4(e) those parts of the photoresist film 10 in which the interconnections are to be formed are removed to expose the surface of the PSG film 2, and simultaneously, eaves owing to the polycrystalline silicon film 11 and the resist film 12 are formed by the side etching.

Figure 4F:
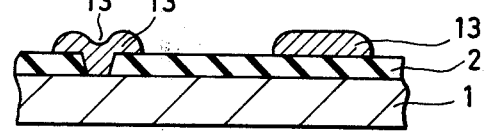

As in Embodiment 2, an aluminum film 13 is deposited by the vacuum evaporation, whereupon the remaining photoresist film 10 is removed together with the polycrystalline silicon film 11 and the resist film 12 deposited thereon. Then, as shown in FIG. 4(f), a contact 13' and the interconnections 13 are formed by the aluminum film left behind.

Also in the present embodiment, the overhang structure having the eaves is formed and then the lift-off is performed as in the case of Embodiment 2, so that a good semiconductor device of extraordinarily high precision is formed.

It is a matter of course that, for the intermediate film (protective film) 11, various insulators such as silicon oxide, silicon nitride and aluminum oxide and various metals such as aluminum, nickel, chromium and titanium can be used besides the polycrystalline silicon. In order to etch them, various etching methods such as ion milling can be employed.

Regarding the photoresist film 10 and the resist film 12, not only various materials can be employed, but also the respective positions can be reversed. In case of arranging the photoresist film in the uppermost part, the use of two masks results in giving rise to an error of a mask registration, and hence, the error needs to be prevented by executing only one time of exposure to light with a mask, the light transmission factor of which differs locally.

What is claimed is:

1. A method of producing a semiconductor device comprising the steps of:
   (a) depositing in succession an insulating film and a resist film reacting to an electron beam onto a surface of a semiconductor substrate;
   (b) irradiating that region of said resist film in which a contact is to be formed and that region thereof in which an interconnection is to be formed, with the electron beam in an optimum dose for said resist film and in a dose less than said optimum dose respectively, thereby to increase solubilities of the irradiated regions;
   (c) developing said resist film, to form an opening extending to said insulating film in said region of said resist film in which said contact is to be formed and simultaneously to reduce a film thickness of said region of said resist film in which said interconnection is to be formed;
   (d) performing etching to remove the exposed region of said insulating film so as to form a contact hole, and simultaneously to remove the resist film in said region in which said interconnection is to be formed, so as to expose a surface of said insulating film;
   (e) depositing a conductive metal film on a whole surface; and
   (f) removing said resist film together with said metal film deposited thereon.

2. A method of producing a semiconductor device as defined in claim 1, wherein said resist film is formed of two different resist films stacked one over the other.

3. A method of producing a semiconductor device as defined in claim 2, wherein said resist films have solubilities for liquid developers that differ from each other.

4. A method of producing a semiconductor device as defined in claim 2, wherein said resist films are a resist film whose solubility is increased by irradiation with the electron beam and a photoresist film whose solubility is increased by irradiation with ultraviolet rays, said method further comprising interposing a protective film between said resist film and said photoresist film, and irradiating said region of said photoresist film in which said contact is to be formed with said ultraviolet rays.

5. A method of producing a semiconductor device as defined in claim 4, wherein said protective film is selected from the group consisting of a polycrystalline silicon film, a silicon dioxide film, a silicon nitride film, an aluminum oxide film, an aluminum film, a nickel film, a chromium film and a titanium film.

* * * * *